United States Patent [19]

Bitschnau et al.

[11] Patent Number: 5,753,901
[45] Date of Patent: May 19, 1998

[54] CHIP FOR AN ELECTRONIC CARD COATED WITH A LAYER OF INSULATING MATERIAL, AND AN ELECTRONIC CARD INCLUDING SUCH A CHIP

[75] Inventors: Thierry Bitschnau; Benoît Thevenot, both of Olivet, France

[73] Assignee: Solaic, Puteaux, France

[21] Appl. No.: 653,314

[22] Filed: May 24, 1996

[30] Foreign Application Priority Data

Jun. 12, 1995 [FR] France .................................. 95 06913

[51] Int. Cl.⁶ ...................................................... G06K 19/06
[52] U.S. Cl. ............................................ 235/492; 257/679
[58] Field of Search .............................. 235/492; 257/679

[56] References Cited

U.S. PATENT DOCUMENTS 5,637,858  6/1997  Hoppe et al. ............................ 235/492

FOREIGN PATENT DOCUMENTS 0246744  3/1987  European Pat. Off. .
0627707  6/1993  European Pat. Off. .
2671417  1/1991  France .
3917707  12/1990  Germany .

Primary Examiner—Harold Pitts
Attorney, Agent, or Firm—Griffin, Butler, Whisenhunt & Kurtossy

[57] ABSTRACT

The chip of an invention for an electronic circuit card comprises a semiconductor microplate having an active face provided with contact pads and on which projections are formed of different heights. The active face of the microplate is coated, at least in part, in a layer of insulating material having a thickness that is greater than or equal to the height of the highest projection, said layer being shaped so as to give free access to the contact pads and having an outer face parallel to the periphery of the active face of the microplate. The layer enables the chip to be implanted in a card body while remaining accurately parallel thereto, which is essential to enable conductive tracks to be made subsequently by silk-screen printing.

7 Claims, 1 Drawing Sheet

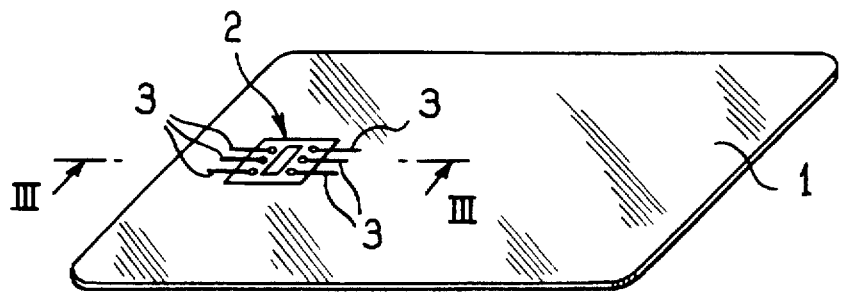
FIG_1
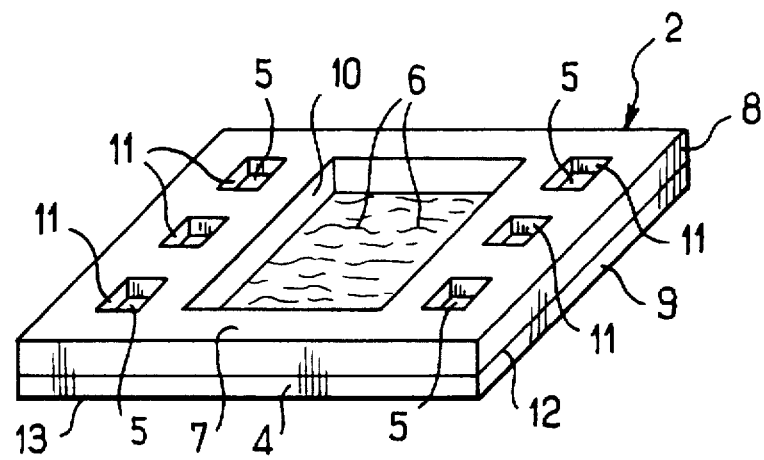
FIG_2
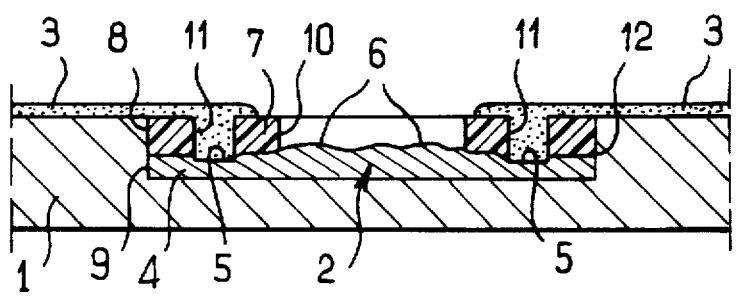
FIG_3
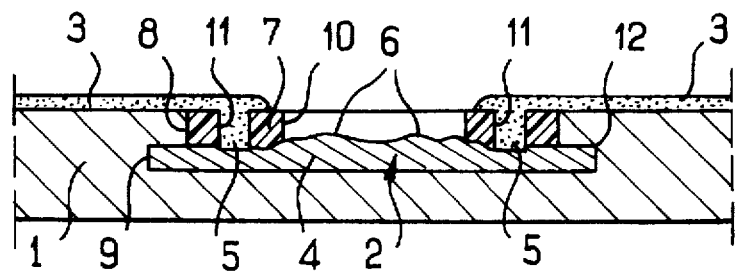
FIG_4
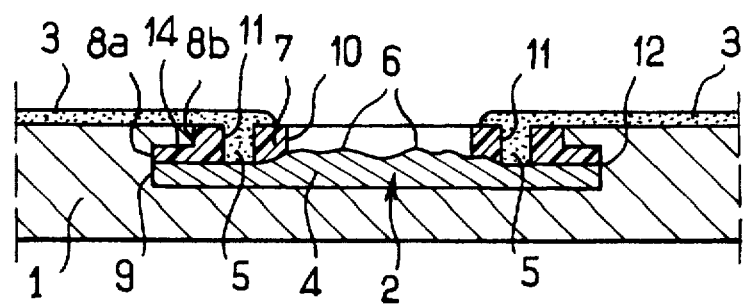
FIG_5

CHIP FOR AN ELECTRONIC CARD COATED WITH A LAYER OF INSULATING MATERIAL, AND AN ELECTRONIC CARD INCLUDING SUCH A CHIP

The present invention relates to a chip for an electronic card, the chip comprising a microplate of semiconductor material having an active face provided with contact pads and on which projections of different heights are formed.

BACKGROUND OF THE INVENTION

It is at present very difficult to use a punch to implant a chip properly in an electronic card body made of plastics material.

Because of the differences in height between the various projections performed on the active face of the microplate, the chip does not remain parallel to the card body while it is being pushed in by the punch. As a result the plastics material it displaces while it is being pushed in tends to spread over the lowest portions of the active face of the microplate and to prevent good connections subsequently being made over said portions between the contact pads and the conductive tracks that are usually deposited on the card body.

OBJECTS AND SUMMARY OF THE INVENTION

The present invention seeks to provide a solution to the above problem, and to do this, it provides a chip for an electronic card and having the structure mentioned above, wherein the active face of the microplate is coated, at least in part, in a layer of insulating material having a thickness that is greater than or equal to the height of the highest projection, said layer being shaped so as to give free access to the contact pads and having an outer face that is parallel to a face which is opposite to the active face.

When implanted by means of a punch, the chip of the invention remains parallel to the card body since the outside face of the insulating material is parallel to the periphery of the active or top face of the microplate.

The risks of the displaced plastics material spreading in unwanted manner over certain portions of the active face of the microplate are thus eliminated, thereby enabling good connections to be established between the contact pads and the conductive tracks which are usually deposited on the card body.

The layer of insulating material may be in the form of a frame having orifices in its portions situated in register with the contact pads.

In a variant, it may also be present in the form of a frame surrounding the contact pads, thereby avoiding the formation of the above-mentioned orifices.

In a first particular embodiment of the invention, the outer peripheral surface of the frame is subdivided into two portions interconnected by a flat, the portion adjacent to the microplate having an outline that is larger than the outline of the other portion.

The plastics material that is displaced during implantation and that extends over the flat consequently opposes accidental extraction of the chip from the card body when the body is subjected to repeated flexing.

In another embodiment of the invention, the frame may be situated inside the periphery of the active face of the microplate.

Under such circumstances, the plastics material that is displaced during implantation spreads over the portion of the active face of the microplate lying outside the frame and, in this case also opposes the chip becoming accidentally separated from the card body when the body is subjected to repeated flexing.

Advantageously, the insulating material is a polyimide, since that resin has the property of forming a layer that is very smooth and very flat once it has polymerized.

Naturally, the present invention also provides an electronic card having a chip that possesses the above-specified characteristics.

BRIEF DESCRIPTION OF THE DRAWING

Three embodiments of the present invention are described below by way of non-limiting example and with reference to the accompanying drawing, in which:

FIG. 1 is a diagrammatic perspective view of an electronic card including a chip of the invention;

FIG. 2 is a perspective view on a larger scale showing the card chip that is visible in FIG. 1;

FIG. 3 is a diagrammatic section view on a larger scale on line III—III of FIG. 1;

FIG. 4 is a view analogous to FIG. 3, but showing a different chip; and

FIG. 5 is a view analogous to FIG. 3, but showing yet another chip.

DETAILED DESCRIPTION

The electronic card that can be seen in FIG. 1 comprises a flat body 1 of plastics material having two opposite large faces that are rectangular, a chip 2 implanted in one of the large faces of the body 1, and conductive areas 3 extending over the same large face of the body 1 as that in which the chip 2 is implanted, the conductive areas 3 being designed to connect the chip 2 to an external reader (not shown) in order to establish data interchange therebetween.

The chip 2 which is shown on a larger scale in FIG. 2 comprises in conventional manner a semiconductor microplate 4 whose active face is provided both with contact pads 5 organized in two parallel rows and with projections 6 essentially constituted by semiconductor circuits.

The projections 6 are of different heights, and if the chip is implanted by means of a punch, it does not remain parallel to the large face of the card body 1 that is designed to receive it. The plastics material constituting the body 1 and displaced under pressure from the chip comes to overlie the lower contact pads 5, thereby preventing a satisfactory electrical connection being made between said contact pads and the corresponding conductive tracks 3.

In order to remedy that drawback, a portion of the active face of the microplate 4 is coated in a layer of insulating material 7 of thickness that is not less than the height of the highest projection 6.

In the example shown in the drawing, the active face of the microplate 4 is square, but there is nothing to prevent it being rectangular or having any other shape.

In addition, the layer 7 is in the form of a frame whose outer peripheral surface 8 extends the peripheral surface 9 of the microplate 4. The central recess 10 of the frame allows some of the projections 6 to be seen, and the frame is provided with orifices 11 at the contact pads 5.

It may be observed at this point that orifices 11 need not be made if the frame is made in such a manner that the empty central portion thereof includes the contact pads.

The outer, or top face, of the layer 7 which is perfectly plane is parallel to the periphery 12 of the active face of the microplate 4. However, since the periphery 12 is itself parallel to the bottom face 13 of the microplate, the outer face of the layer 7 is thus likewise parallel to the bottom face 13.

Thus, when a punch is used for implanting the chip 2, the chip remains parallel to the card body 1 until the outer face of the layer 7 comes into the plane of said top face of the card body. After the chip has been implanted, the outer and top faces of the layer 7 and of the card body 1 are thus accurately coplanar, which makes it possible to implement the conductive tracks 3 under good conditions, by silk-screen printing or by any other printing technique.

The chip that can be seen in FIG. 4 differs from that described above solely by the fact that the outer peripheral surface 8 of the frame defined by the layer of insulating material is situated inside the periphery 12 of the active face of the microplate 4.

When the chip 2 is implanted, the plastics material that it displaces to penetrate into the card body 1 comes to overlie the portion of the microplate 4 that is situated outside the frame, as shown.

Consequently, the chip cannot be separated from the card body when the card body is subjected to repeated flexing, thereby considerably increasing the lifetime of the electronic card in use.

The chip visible in FIG. 5 differs from the above-described chips in that the outer peripheral surface 8 of the frame is subdivided into two portions 8a and 8b that are interconnected by a flat 14, the portion 8a which is adjacent to the microplate 4 extending in line with the peripheral surface 9 thereof.

The plastics material displaced while the chip 2 is being implanted extends over the flat 14, as shown. It therefore prevents the chip being extracted from the card body when the body is subjected to repeated flexing.

Naturally, the outer peripheral surface 8 of the frame could be situated inside the periphery 12 of the active surface of the microplate 4 as shown in FIG. 4, and also have a flat 14 as shown in FIG. 5.

In the embodiments described above, the insulating material used for forming the layers 7 is a plastics material, and in particular a polyimide. This plastics material is selected because of its suitability for giving the layers 7 a free face that is extremely smooth and flat once the material has polymerized.

To complete the description, it is specified that the microplates 4 come from a silicon wafer of the kind commonly used for manufacturing chips, and the insulating material constituting the layers 7 is preferably deposited by photolithography on the silicon wafer after the integrated circuits have been made but before it is sawn up to separate the various chips.

When the outer peripheral surface 8 of the frames of the various chips include respective flats 14, then the flats can be machined either before or after the sawing operation.

Finally, it is specified that the layer of insulating material 7 protects the chips against the thermal shock which the punch could cause if it is a hot punch, and that it provides insulation relative to the conductive tracks that are subsequently deposited by silk-screen printing.

We claim:

1. A chip for an electronic card, the chip comprising a microplate of semiconductor material having an active face provided with contact pads and on which projections of different heights are formed, wherein the active face of the microplate is coated, at least in part, in a layer of insulating material having a thickness that is greater than or equal to the height of the highest projection, said layer being shaped so as to give free access to the contact pads and having an outer face that is parallel to a face which is opposite to the active face.

2. A chip according to claim 1, wherein the layer of insulating material is in the form of a frame including orifices in its portions situated in register with the contact pads.

3. A chip according to claim 1, wherein the layer of insulating material is in the form of a frame surrounding the contact pads.

4. A chip according to claim 2, wherein the outer peripheral surface of the frame is subdivided into two portions interconnected by a flat, the portion adjacent to the microplate having an outline that is larger than the outline of the other portion.

5. A chip according to claim 2, wherein the frame is situated inside the periphery of the active face of the microplate.

6. A chip according to claim 1, wherein the insulating material is a polyimide.

7. An electronic card including a chip according to claim 1.

* * * * *